(12) United States Patent
Regan

(10) Patent No.: US 8,169,769 B2
(45) Date of Patent: May 1, 2012

(54) ELECTROSTATIC CHUCK POWER SUPPLY

(75) Inventor: Kenneth P. Regan, Beverly, MA (US)

(73) Assignee: TEL Epion Inc., Billerica, MA (US)

( * ) Notice: Subject to any disclaimer, the term of this patent is extended or adjusted under 35 U.S.C. 154(b) by 154 days.

(21) Appl. No.: 12/749,999

(22) Filed: Mar. 30, 2010

(65) Prior Publication Data

US 2010/0182036 A1    Jul. 22, 2010

Related U.S. Application Data

(63) Continuation-in-part of application No. 12/208,404, filed on Sep. 11, 2008, now Pat. No. 7,948,734.

(51) Int. Cl.
*H01L 21/683* (2006.01)
*H01T 23/00* (2006.01)

(52) U.S. Cl. ......... 361/234; 361/235; 279/128; 279/134

(58) Field of Classification Search .......... 361/234–235; 279/128, 134
See application file for complete search history.

(56) References Cited

U.S. PATENT DOCUMENTS

| | | | |
|---|---|---|---|
| 4,361,762 A | 11/1982 | Douglas | |
| 4,886,971 A | 12/1989 | Matsumura et al. | |
| 4,916,311 A | 4/1990 | Fuzishita et al. | |
| 5,103,367 A | 4/1992 | Horwitz et al. | |
| 5,436,790 A | 7/1995 | Blake et al. | |
| 5,812,361 A * | 9/1998 | Jones et al. | 361/234 |
| 5,969,934 A | 10/1999 | Larsen | |
| 6,388,861 B1 * | 5/2002 | Frutiger | 361/234 |
| 2002/0130275 A1 | 9/2002 | Mack et al. | |
| 2003/0210510 A1 * | 11/2003 | Hann et al. | 361/234 |
| 2007/0127188 A1 * | 6/2007 | Yang et al. | 361/234 |

FOREIGN PATENT DOCUMENTS

JP    62296357 A    12/1987

OTHER PUBLICATIONS

Isao Yamada et al., "Materials Processing by Gas Cluster Ion Beams", Materials Science and Engineering Reports, vol. 34, Issue 6, pp. 231-295, Oct. 30, 2001 (ISSN: 09S7-796X).
Saitoh, Y. et al., Acceleration of cluster and molecular ions by TIARA 3 MV tandem accelerator, vol. 452, No. 1-2, Sep. 21, 2000, pp. 61-66, XP004210610, ISSN: 0168-9002.
Yamada, I. et al., Surface modification with gas cluster ion beams, Nuclear Instruments & Methods in Physics Research, vol. B79, Nov. 2, 1992, pp. 223-226, XP001031961, ISSN: 0168-583X.
U.S. Patent and Trademark Office, Notice of Allowance issued in related U.S. Appl. No. 12/208,404 dated Oct. 13, 2010, 10 pp.

* cited by examiner

*Primary Examiner* — Jared Fureman
*Assistant Examiner* — Terrence Willoughby
(74) *Attorney, Agent, or Firm* — Wood, Herron & Evans, LLP

(57) ABSTRACT

A detection circuit is provided for a power supply for an electrostatic chuck generating a trapezoidal waveform with approximately flat tops and minimal dead-time between phase reversals. The detection circuit includes an amplifying circuit which receives inputs from a secondary winding of a transformer of the power supply and produces an amplified buffered signal. A chucking detect circuit receives the signal from the amplifying circuit and is configured to produce a first signal indicative of a substrate on the electrostatic chuck and a second signal indicative of an electrostatic chuck without a substrate. A chucking quality circuit receives the signal from the amplifying circuit and produces a signal indicative of a quality of the chucking of the substrate. A movement detection circuit receives the signal from the amplifying circuit and produces a signal indicative of movement of the substrate on the electrostatic chuck.

21 Claims, 12 Drawing Sheets

ELECTROSTATIC CHUCK POWER SUPPLY

CROSS-REFERENCE TO RELATED APPLICATIONS

This application is a continuation-in-part of U.S. application Ser. No. 12/208,404, entitled "Electrostatic Chuck Power Supply", filed Sep. 11, 2008, the disclosure of which is hereby incorporated by reference in its entirety.

FIELD OF THE INVENTION

The invention relates generally to electrostatic chucks for holding a substrate and in particular a detection of the substrate on the electrostatic chuck.

BACKGROUND OF THE INVENTION

Recently, in the semiconductor industry, advanced processing techniques, such as CVD, dry etching, or gas cluster ion beam processing in a vacuum environment, are commonly used in the semiconductor manufacturing process. It is extremely challenging, if not nearly impossible, to use a vacuum chuck to hold a semiconductor wafer or other substrate in a vacuum chamber. Some contemporary solutions to this problem generally include mechanical holding systems that hold substrates made from semiconducting materials, typically silicon or silicon-containing materials, at their periphery. However, silicon wafers, for example, are extremely brittle and there is always some risk of tiny pieces chipping off of the semiconductor, or other substrate when using a mechanical holding system. Generating such small dust particles from the chipping may result in serious problems for the quality of production and potentially affect yield rate.

Semiconductor processing equipment, therefore, has increasingly relied upon the use of electrostatic clamping methods for holding substrates in place while processing, rather than mechanical clamping methods. The advantages of using electrostatic clamping methods generally include fewer particles being generated and, in some cases, simplified clamping hardware. In the effort to reduce particles in the vacuum, it is also desirable to have as few in-vacuum connections and components.

Contemporary electrostatic chuck designs are of either DC or AC configurations, and generally comprise one, two, or more poles. The chucks typically comprise a dielectric ceramic layer, or similar dielectric material, with the poles comprising a conductive material just below the clamping surface. High voltages are applied to a single pole, or pole-to-pole, relying on field changes in the dielectric layer effecting opposite field changes in the substrate, resulting in electrostatic forces to hold the substrate to the chuck.

The clamping force is directly proportional to the dielectric constant and the net pole voltage difference, and inversely proportional to the dielectric thickness. Therefore, the thinner the dielectric, the higher the clamping force. As higher through-put demands require higher-speed scanning, higher inertial forces are generated requiring higher clamping forces. Thus, it is desirable to have a chuck with the thinnest dielectric possible. However, one tradeoff to a thin dielectric is the voltage breakdown through it.

With AC chucks, a sinusoidal voltage waveform will have to have a peak voltage of about 1.4 times the desired clamping voltage in order to attain the same average force if DC was used instead. The peak-to-peak voltages required for AC chucks can become problematic for chucks with thin dielectrics as the peak voltages necessary for required clamping forces approach the breakdown voltages of the dielectric. DC chucks also often require phase reversal and decaying AC fields in order to discharge the net field, otherwise the substrate would never de-chuck.

With DC chucks, contemporary power supplies require an external floating signal super-imposed onto the high-voltage chuck signals, using frequency-to-voltage techniques to create a substrate present signal in order to test for presence of a substrate on the chuck. This technique requires extra components and sensors in the vacuum, which are undesirable as they are a potential source of particles in the vacuum. Also, this technique may not work with an AC output.

What is needed therefore is a power supply for an electrostatic chuck that can provide AC power to an AC chuck without the concern of the peak-to-peak voltage and be able to detect the presence of a substrate on either an AC or a DC chuck.

SUMMARY OF THE INVENTION

Embodiments of a detection circuit for a power supply for an electrostatic chuck are provided. The power supply may include a signal generating circuit configured to generate an input, a power output circuit configured to produce a signal for the electrostatic chuck in response to the input signal, and a feedback circuit electrically connected to the power circuit and configured to feed back a voltage signal responsive to a voltage on the electrostatic chuck. The signal from the power output circuit may be a trapezoidal waveform with approximately flat tops and minimal dead-time between phase reversals. The detection circuit may be electrically connected to the electrostatic chuck through the feedback circuit of the power supply and includes, in some embodiments, an amplifying circuit receiving inputs from the power output circuit and producing an amplified buffered signal, a chucking quality circuit receiving the signal from the amplifying circuit, and configured to produce a signal indicative of a quality of a chucked substrate, and a movement detection circuit receiving the signal from the amplifying circuit, and configured to produce a signal indicative of movement of the substrate on the chuck.

In some embodiments, the detection circuit may further include a chucking detect circuit which receives the signal from the amplifying circuit and is configured to produce a first signal indicative of a substrate on the chuck and a second signal indicative of a chuck without a substrate. In some configurations of the detection circuit, the chucking quality circuit may include a circuit configured to rectify and filter the amplified buffered signal producing a DC output, where an increasing DC value in the DC output indicates a decrease in chucking quality. In other configurations of the detection circuit, the movement detection circuit may include a circuit configured to calibrate the amplified buffered signal with a threshold voltage, and a pulse stretcher configured to produce a signal representative of a short duration pulse, but having a duration greater than the short duration pulse, in response to a triggering event. In a specific embodiment, the pulse stretcher may be a one-shot. In some embodiments, the pulse stretcher may be triggered on a rising edge of the amplified buffered signal, though a trailing edge may also be used in some embodiments.

Some embodiments include a semiconductor processing system. The processing system may include an electrostatic chuck and a power supply. The power supply may include a signal generating circuit configured to generate an input, a power output circuit configured to produce a signal for the electrostatic chuck in response to the input signal, a feedback circuit electrically connected to the power circuit and configured to feed back a voltage signal responsive to a voltage on the electrostatic chuck, and a detection circuit electrically connected to the electrostatic chuck, through the feedback circuit and configured to interpret the voltage signal and to produce an output signal indicative of a condition of a substrate on the electrostatic chuck.

In some embodiments, the signal from the secondary winding may be a trapezoidal waveform with approximately flat tops and minimal dead-time between phase reversals. In some embodiments, the detection circuit may include an amplifying circuit receiving inputs from the secondary winding and producing an amplified buffered signal, and a chucking detect circuit receiving the signal from the amplifying circuit, and configured to produce a first signal indicative of a substrate on the chuck and a second signal indicative of a chuck without a substrate.

In other embodiments, the detection circuit may include the amplifying circuit receiving inputs from the secondary winding and producing an amplified buffered signal and a chucking quality circuit receiving the signal from the amplifying circuit and producing a signal indicative of a quality of a chucked substrate. In some of these embodiments, the chucking quality circuit may include a circuit configured to rectify and filter the amplified buffered signal producing a DC output. In these embodiments, an increasing DC value in the DC output may indicate a decrease in chucking quality.

In some embodiments the detection circuit may include the amplifying circuit receiving inputs from the secondary winding and producing an amplified buffered signal and a movement detection circuit which receives the signal from the amplifying circuit produces a signal indicative of movement of the substrate on the chuck. In these embodiments, the movement detection circuit may include a circuit configured to calibrate the amplified buffered signal with a threshold voltage and a pulse stretcher configured to produce a signal representative of a short duration pulse, which has a duration greater than the short duration pulse. In a specific embodiment, the pulse stretcher may include a one-shot. In another specific embodiment, the pulse stretcher may be triggered on a rising edge of the amplified buffered signal.

Embodiments of also provide a method of detecting a condition of a substrate on an electrostatic chuck in a processing apparatus. A voltage may be sensed on an output of a power supply connected to the electrostatic chuck for supplying a chucking voltage to the chuck through a feedback circuit. A change in the sensed voltage may be detected which is indicative of a change of a condition of the substrate on the chuck. An operation of the processing apparatus may then be controlled in response to detecting the change in sensed voltage.

In some embodiments, sensing the voltage on the output of the power supply may include filtering and buffering the voltage to generate a DC voltage. In some of these embodiments, the detected change in the sensed voltage may include an increasing DC value and the change of the condition may include an increase in buildup of material between the chuck and the substrate. In these embodiments, the operation may include initiating a cleaning or replacement of the chuck. In other embodiments, sensing the voltage on the output of the power supply may include calibrating the voltage on the output of the power supply with a reference voltage and detecting a change in the sensed voltage may include detecting a short duration pulse in the voltage on the output of the power supply that exceeds the reference voltage, and generating a signal representative of a short duration pulse with a pulse stretcher having a duration greater than the short duration pulse. In some embodiment, the change of the condition may be a movement of the substrate on the chuck.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the invention.

It should be understood that the appended drawings are not necessarily to scale, presenting a somewhat simplified representation of various features illustrative of the basic principles of the invention. The specific design features of the sequence of operations as disclosed herein, including, for example, specific dimensions, orientations, locations, and shapes of various illustrated components, will be determined in part by the particular intended application and use environment. Certain features of the illustrated embodiments have been enlarged or distorted relative to others to facilitate visualization and clear understanding. In particular, thin features may be thickened, for example, for clarity or illustration.

DETAILED DESCRIPTION OF THE INVENTION

Embodiments of the invention generate trapezoidal waveforms with essentially flat tops and minimal dead-time between phase reversals for AC electrostatic chucks without the concern of peak voltages as with sinusoidal or triangular waveforms. The output of the embodiments of the invention may be changed from AC to DC. This may even be accomplished while the power supply is running. Additionally, in DC mode, a change in an output voltage ripple may be used to detect the presence of a substrate on the chuck. Similarly, in AC mode, a change in an output current ripple may be used to detect the presence of the substrate on the chuck.

Figure 1:
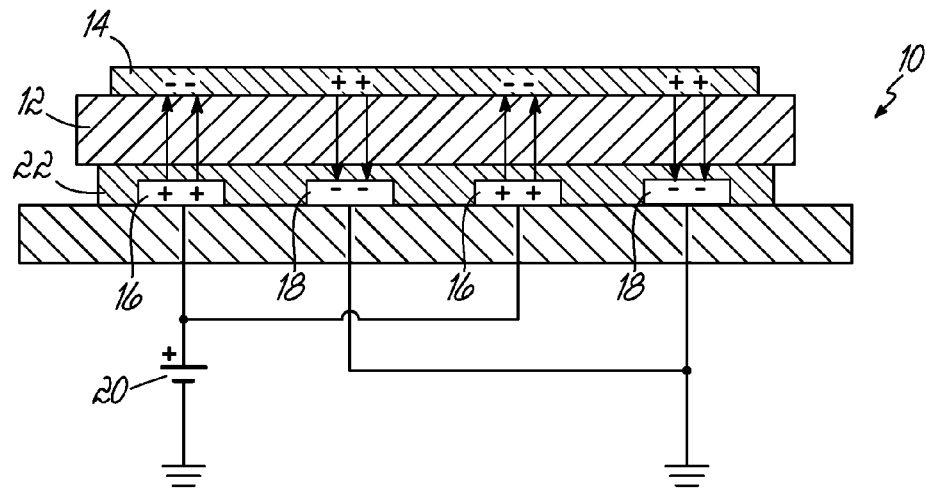
FIG. 1 is a cross-sectional view of an exemplary electrostatic chuck.

Turning now to the drawings, FIG. 1 is a cross sectional diagram of an exemplary DC electrostatic chuck 10. Electrostatic chucks 10 generally have the structure of a capacitor, which includes two electrodes adjacent to a dielectric 12. One of the electrodes is the object on the chuck, here, a semiconductor substrate 14, such as a silicon wafer. While reference is made to a semiconductor substrate such as the silicon wafer, it should be understood that the invention should not be so limited, but rather, the "object" may be any substrate 14, including, for example, glass panels for displays, substrates for hard disk magnetic heads, substrates from which optical components are manufactured, etc. The other of the electrodes in FIG. 1 are interdigitated electrodes 16, 18. When the interdigitated electrodes 16, 18 are employed and a high voltage source 20 is applied, an equivalent circuit for the electrostatic chuck 10 would be a series connection of two capacitors. Because the conductivity of substrate 14 (e.g. silicon wafer) is much higher than the dielectric 12, the substrate 14 is assumed to be a conductor.

The fundamental structure of the electrostatic chuck 10 is schematically shown in FIG. 1. The main part of the electrostatic chuck 10 includes interdigitated electrodes 16, 18 and the dielectric 12. The interdigitated electrodes 16, 18 may be created from an etched printed circuit board by removing copper film, though other conductive films may also be used. The dielectric 12 is placed over the interdigitated electrodes 16, 18. Since the thickness of a copper sheet is generally about 35 μm, there may be an air gap between the interdigitated electrodes 16, 18 of the same size. In order to avoid a spark discharge between the interdigitated electrodes 16, 18, the space is filled with an insulating material 22.

Because the potential of the substrate 14 could be the ground level, one high voltage source 20 is employed in the exemplary electrostatic chuck 10 in FIG. 1 for simplicity. However, multiple voltage sources, i.e. two in this example, could also be used. If the likelihood for the substrate 14 to be grounded is low, one high-voltage source may actually be preferable, especially in the case of AC applied voltages.

Figure 2:
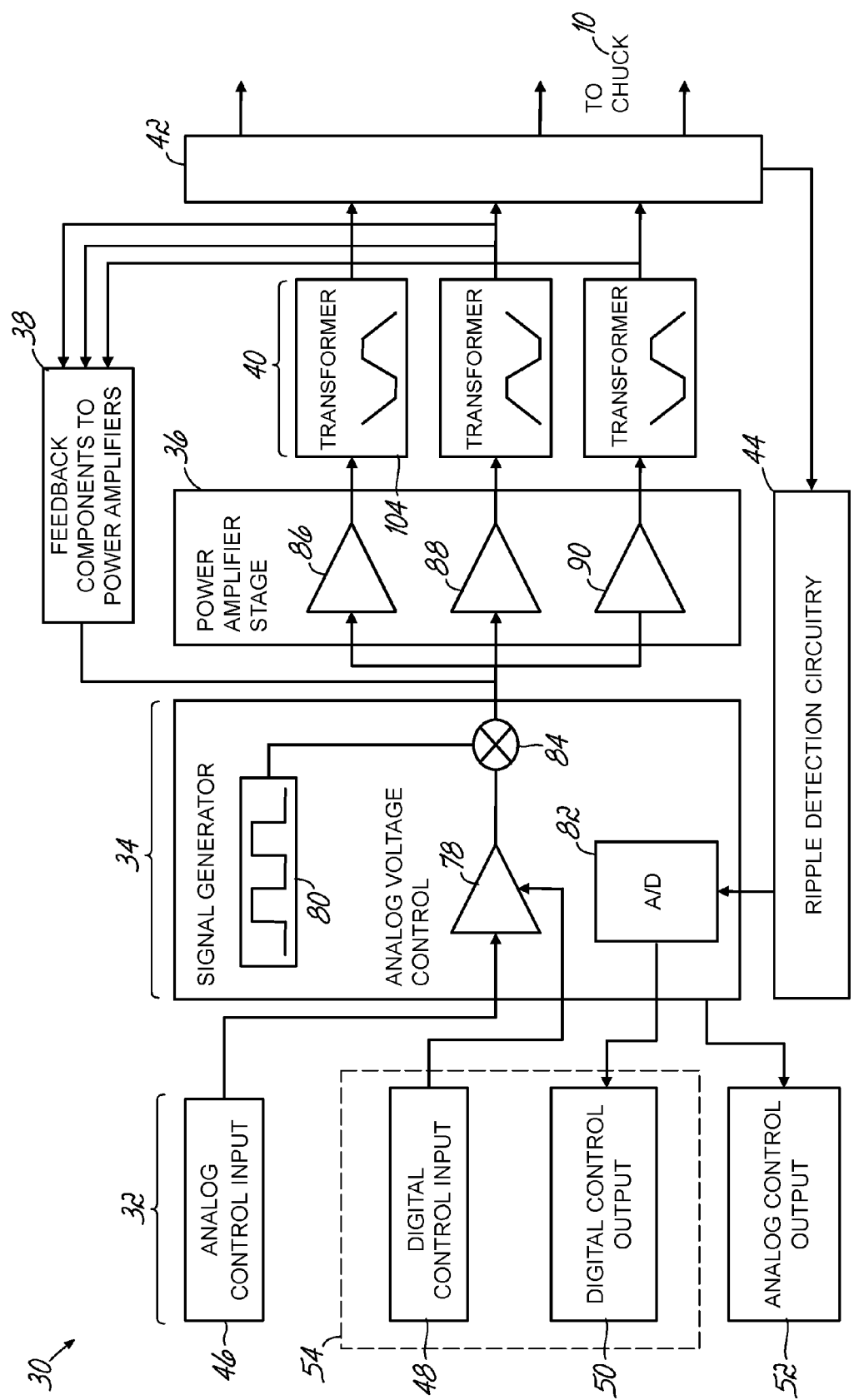
FIG. 2 is a system block diagram of an embodiment of the power supply consistent with the invention for use with the electrostatic chuck in FIG. 1.

A system diagram in FIG. 2 shows the components of an electrostatic power supply 30 consistent with embodiments of the invention. The power supply 30 generally includes control inputs and outputs 32, a signal generating circuit 34, a power amplification stage 36 with feedback 38, transformers 40, and an AC/DC switch or rectifier 42 which sends the amplified signals to an electrostatic chuck 10. The power supply 30 additionally includes ripple detection circuitry 44, which may be used to determine if a substrate 14 is present on the electrostatic chuck 10. Additionally the ripple detection circuitry 44 may also be used, in some embodiments, to detect slipping or other movement of the substrate 14 on the electrostatic chuck 10 or overall chucking quality, as will be described in more detail below. In some embodiments, the control inputs/outputs 32 of power supply 30 include two inputs: an analog control input 46 and a digital control input 48. The analog control input 46 is an amplitude adjustment, which allows for a peak-to-peak voltage adjustment of the power supply 30. The digital control input 48 is a digital signal indicating that a substrate 14 is to be placed on the electrostatic chuck 10. In some embodiments, the digital signal for the digital control input 48 may be a "CHUCK" signal to indicate whether an electrostatic chuck 10 is enabled and whether a substrate 14 should be placed on the electrostatic chuck 10. In some embodiments, the control inputs/outputs 32 of power supply 30 include a digital control output 50 that provides two signals. One of the signals may be a "CHUCKED" signal to indicate that a substrate 14 is present on the electrostatic chuck 10. The other signal may be a "CHUCK FLT" signal to indicate a fault in the chucking process, which will be discussed in further detail below. The control inputs/outputs 32 of power supply 30 may further include an analog control output 52, which may also provide two signals. These two signals may be used to determine slip of the substrate 14 on the electrostatic chuck 10. Additionally, these two signals may be used to determine substrate-to-substrate chucking quality by analyzing deterioration, over time, of the chuck force, facilitating anticipation of necessary periodic maintenance or prediction of failure.

Figure 3:
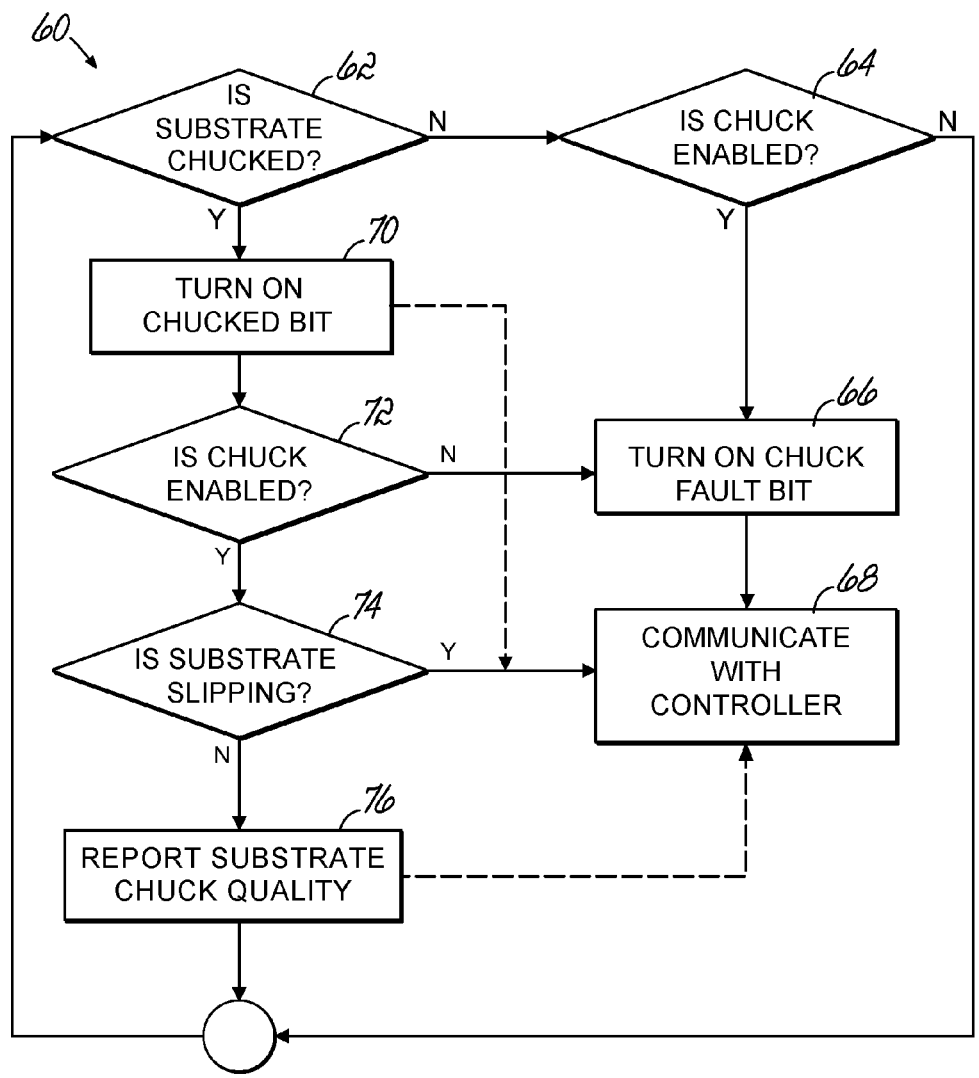
FIG. 3 is a flowchart of the logic of the digital circuitry of the system block diagram in FIG. 2.

Digital components 54 of the power supply 30, including the digital control input 48 and the digital control output 50, may be implemented according to the flowchart 60 in FIG. 3. A check of the CHUCKED output signal is made to determine if a substrate 14 is present on the electrostatic chuck 10 (block 62). If the CHUCKED output signal indicates that there is no substrate 14 present on the electrostatic chuck 10 ("No" branch of decision block 62), then a check is made to see if the electrostatic chuck 10 is enabled to receive a substrate 14 (block 64). If the CHUCK input signal indicates that the electrostatic chuck 10 is not enabled ("No" branch of decision block 64), then the process continues at decision block 62. If, however, the CHUCK input signal indicates that the electrostatic chuck 10 is enabled and should have a substrate 14 present ("Yes" branch of decision block 64), the CHUCK FLT bit is turned on indicating a chucking fault (block 66). The CHUCK FLT output may sent to a controller of a system utilizing the electrostatic chuck 10 (block 68), which may then take further action, such as retrying a substrate delivery and chucking process, notifying an operator for manual intervention, shutting down the system, or other actions that would be known to one of ordinary skill in the art.

If there is a substrate 14 present on the electrostatic chuck 10 ("Yes" branch of decision block 62), the CHUCKED bit is turned on to indicate the presence of the substrate 14 (block 70). A check is then made to determine if the electrostatic chuck 10 is enabled to receive a substrate 14 (block 72). If the CHUCK input signal indicates that the electrostatic chuck 10 is not enabled ("No" branch of decision block 72) and there is a substrate 14 present, the CHUCK FLT bit is turned on indicating a chucking fault (block 66) and the process continues as disclosed above. If, however, the CHUCK input signal indicates that the electrostatic chuck 10 is enabled ("Yes" branch of decision block 72), then a check may be performed to determine if the substrate 14 is slipping (block 74). If there is an indication that the substrate 14 is slipping ("Yes" branch of decision block 74), then the slipping information may be communicated to the system controller (block 68) and further action may be taken. If there is no indication of the substrate 14 slipping ("No" branch of decision block 74), a substrate-chuck quality may be reported (block 76) and the process continues at decision block 62. In some embodiments, the substrate-chuck quality may also be communicated to the controller (block 68). In other embodiments, a report of substrate-chuck quality (block 76) may also be performed if the substrate 14 is slipping (not shown).

The input CHUCK signal and output CHUCKED and CHUCK FLT signals may be implemented such that when the signals are high, they indicate a positive condition of the signal. In alternate embodiments, the CHUCK, CHUCKED, and CHUCK FLT signals may also be implemented such that the signals indicate a positive condition when they are pulled low. One of ordinary skill in the art will recognize that any combinations of high or low may be used for any of the digital input or output signals without departing from the scope of the invention.

Returning again to FIG. 2, the signal generating circuit 34 includes an analog voltage control 78, square wave generator 80, and an analog to digital signal converter 82, which may be used to convert analog signals to the digital control output 50. Outputs from the analog voltage control 78 and square wave generator 80 may be summed in a summing circuit 84 prior to being sent to the power amplification stage 36. The square wave generator 80 may be an XR-2207 Monolithic Function Generator manufactured by Exar Corporation of Fremont, Calif., though any wave generator able to generate a square wave may be used. This particular square wave generator 80 has an operating frequency from about zero Hz to about 1 MHz. However, the magnitude of ripple current or ripple voltage that is used for determining the presence or absence of a substrate 14 decreases as frequency increases. Therefore, lower frequencies may be used to produce a peak-to-peak ripple that advantageously makes sensing easier. An exemplary operating frequency range may be from about 30 Hz to about 100 Hz, though higher frequencies may be used. For many embodiments, the typical operating frequency is in the range of about 30 Hz to about 40 Hz.

The square wave output of the signal generating circuit 34 is sent to the power amplification stage 36. The power amplification stage 36 contains an amplifying circuit 86, 88, 90 corresponding to each of a plurality of poles of the electrostatic chuck 10. Many DC electrostatic chucks are monopolar, though they may also have multiple poles. AC electrostatic chucks are generally bipolar and higher. Each pole of the AC or DC chuck may be driven by separate amplifying circuits 86, 88, 90. The embodiment illustrated in the system diagram in FIG. 2 consists of three poles. One of ordinary skill in the art will recognize that the number of poles is a property of the electrostatic chuck 10 and that the power supply 30 may be designed to include a proper number of amplifying circuits 86, 88, 90 to match the number of poles for the electrostatic chuck 10 it is driving.

Figure 4:
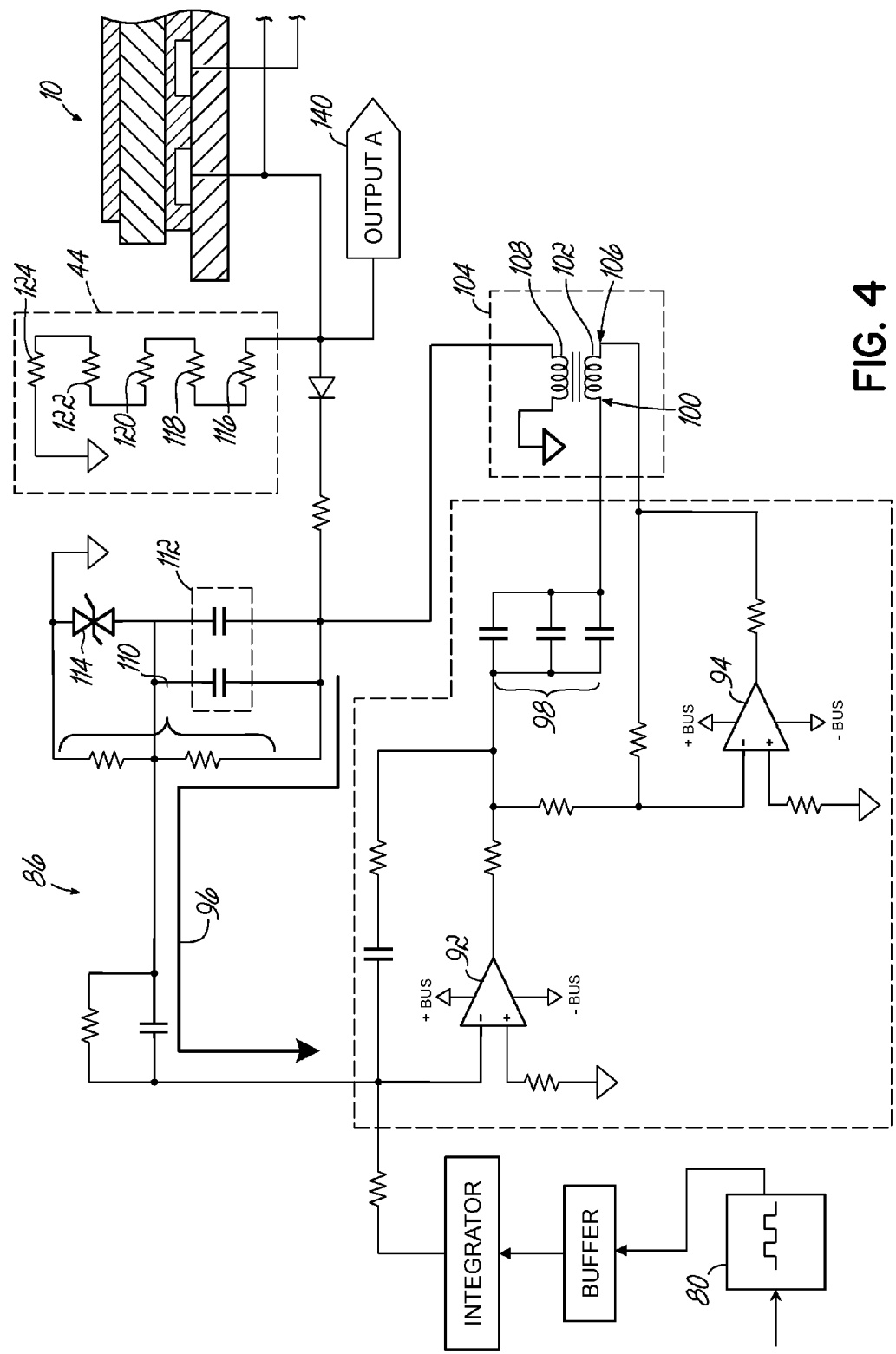
FIG. 4 is a schematic diagram of several of the components in the system block diagram in FIG. 2.
Figure 5A:
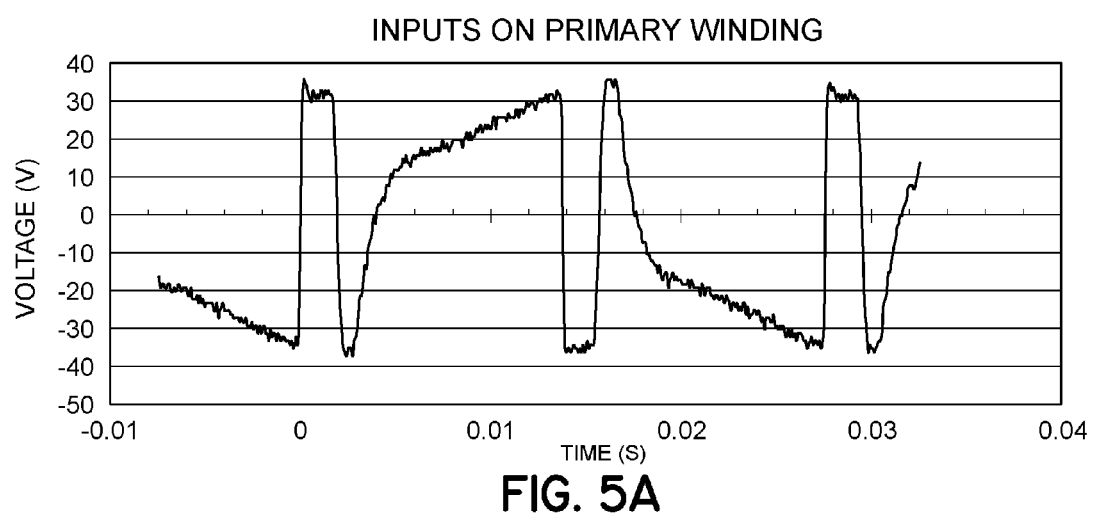
FIG. 5A is a graph of a signal applied to a primary winding of a transformer in the system block diagram in FIG. 2.
Figure 5B:
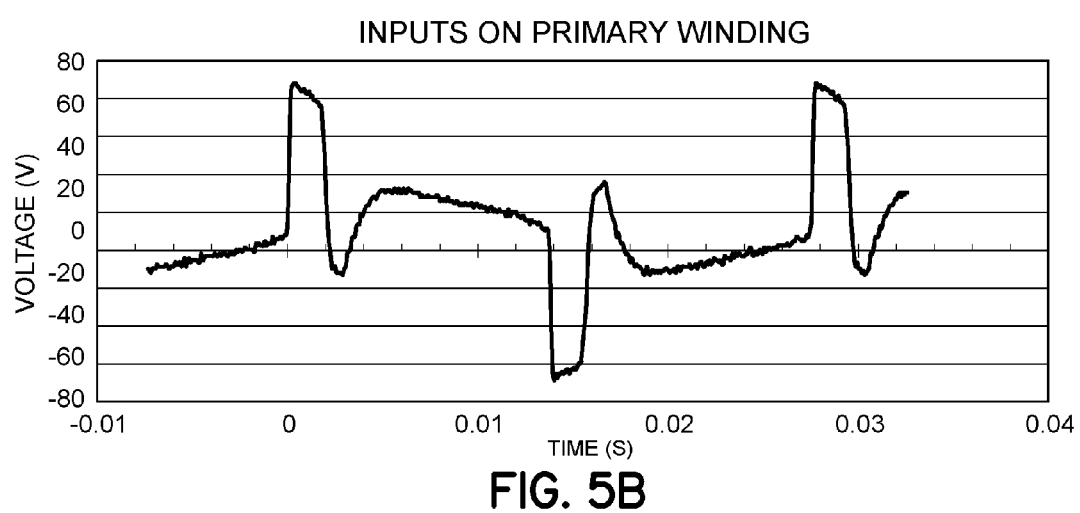
FIG. 5B is a graph of a second signal applied to the primary winding of the transformer in the system block diagram in FIG. 2.

FIG. 4 provides additional detail for an amplifying circuit 86 of the power amplification stage 36. The amplifying circuit 86 includes a first amplifier 92 and a second amplifier 94. These amplifiers may be OPA541AP high power monolithic operational amplifiers manufactured by Texas Instruments, though any suitable high power amplifiers may be used. The input to first amplifier 92 includes the square wave signal generated from the square wave generator 80 in addition to a portion of the output signal 96 which is fed back to the power amplification stage 36. In a specific embodiment, the first amplifier 92 amplifies the input to about 40-60 volts. This output is sent through DC blocking capacitors 98 and then to a first end 100 of a primary winding 102 of a transformer 104. The output is additionally sent to the input of the second amplifier 94, which also amplifies the input to about 40-60 volts. The output of the second amplifier 94 is sent to a second end 106 of the primary winding 102 of the transformer 104. The two amplifiers 92, 94 are run counter phase in order to drive two times the signal on the primary winding 102 of the transformer 104. FIG. 5A and FIG. 5B contain graphs of the waveforms at the first end 100 and second end 106, respectively, of the primary winding 102 of the transformer 104. As can also be seen from the graphs in FIG. 5A and FIG. 5B, the maximum voltage, for this embodiment, applied to the primary winding 102 is about 100 V. In this embodiment, the turns ratio of the transformer 104 is about 10:1, though other turns ratios may be used in other embodiments to step up the voltage on a secondary winding 108 of the transformer 104 which is configured to be electrically connected to the electrostatic chuck 10.

By applying the output waveforms of the amplifiers 92, 94 to ends 100, 106 of the primary winding 102 of the transformer 104, the waveforms are effectively summed. The resulting waveform on the secondary winding 108 of the transformer 104 can be seen in the graph in FIG. 6. The maximum peak-to-peak voltage of the output wave form on the secondary winding 108 is about 1,000 V, though the output is fully adjustable from about zero to about 2,000 V peak-to-peak. The output voltage may be set appropriately to accommodate any dielectric material and thickness.

Figure 6:
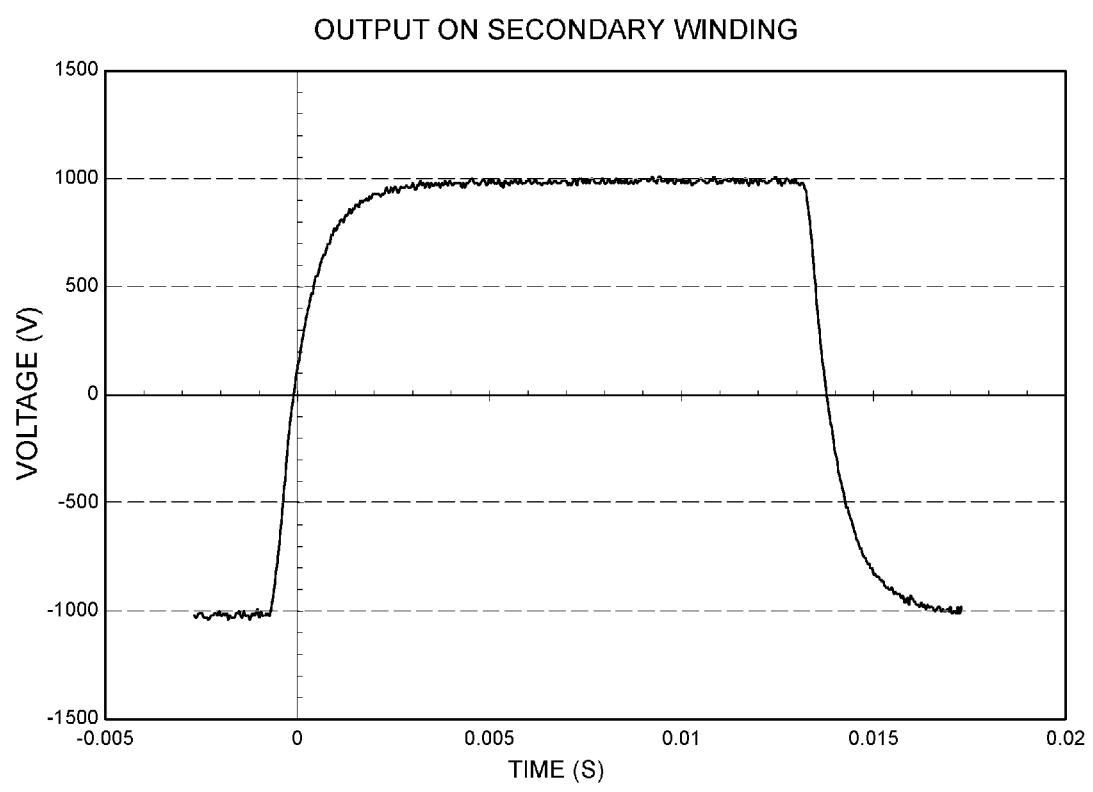
FIG. 6 is a graph of the output signal from the secondary winding of the transformer in the system block diagram in FIG. 2.

As can be seen in the graph in FIG. 6, the output waveform is generally trapezoidal in shape with an essentially flat top. As also can be seen in the graph in FIG. 6, the output waveform also has short rise and fall times, minimizing dead time between reversals. This trapezoidal waveform may be applied directly from the secondary winding 108 of the transformer 104 to one of the poles of an AC electrostatic chuck. In AC mode, the flat-topped waveforms allow for much higher RMS voltages than sinusoidal or triangular waveforms without the associated high peak voltage stress. DC-like performance may also be attained using this trapezoidal, AC output power supply. The trapezoidal output may be rectified and then sent to one of the poles of the DC electrostatic chuck 10 as shown in FIG. 4, for example.

The signal from the secondary winding 108 is reduced by a voltage divider 110 in order to reduce the signal to the portion of the output signal 96 to a manageable level in order to be fed back into the input of the first amplifier 92. In a specific embodiment, the voltage is divided down to 1/10 of the output to compensate for the 10:1 ratio of the transformer 104. In other embodiments, this voltage divider 110 may divide the voltage differently to correspond to either a different transformer ratio or a larger or smaller feedback signal, which may affect the overall shape of the trapezoidal waveform. Additionally, the feedback loop includes compensation capacitors 112 to prevent oscillation and a transient voltage suppressor element 114 to protect from transients.

Referring again to FIG. 2, each amplifying circuit 86, 88, 90 in the power amplification stage 36 has a corresponding transformer, i.e. amplifying circuit 86 to transformer 104, in the transformers 40. Each of the outputs of the transformers 40 may be sent to the AC/DC switch 42 to connect to either an AC or DC electrostatic chuck, as discussed above. Additionally, a ripple may be detected on the output of the transformers 40 by ripple detection circuitry 44 for each pole from the power supply. This output (OUTPUT A 140 in FIG. 4) may also be further processed to determine overall chucking quality or to detect slippage or other movement of the substrate 14 on the electrostatic chuck 10 as set forth below. In AC mode, the output itself can also be used to sense whether there is a substrate 14 present on an AC electrostatic chuck in that during the rise-time of the power supply output (from the transformers 40), the output current will rise proportionately in response to a capacitance change when the substrate 14 is clamped. This current may then be used to determine the presence or absence of a substrate 14 on the AC electrostatic chuck. In DC mode, if the output is left unfiltered (as shown in FIG. 4), a power supply output ripple will be present.

Figure 7:
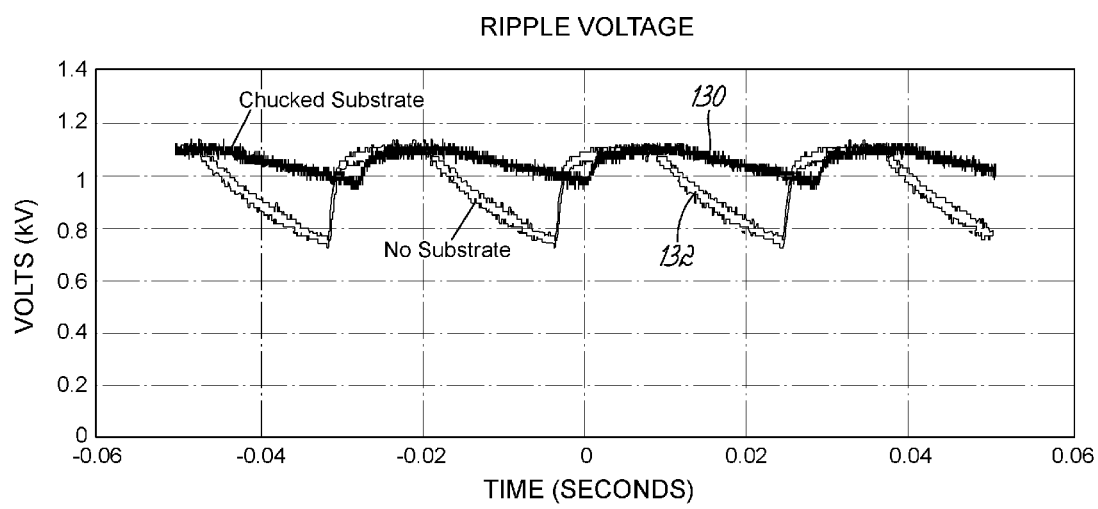
FIG. 7 is a graph of the ripple voltage output from a component in the system block diagram in FIG. 2.

Once a substrate 14 has been clamped, output ripple falls due to the increase in capacitance created by the substrate-plus-chuck interface. The DC ripple may be measured as a voltage across resistors 116-124 as shown in FIG. 4. FIG. 7 illustrates a change in magnitude of the ripple voltage between a curve 130 representing ripple voltage for an electrostatic chuck 10 with a substrate 14 present and a curve 132 representing ripple voltage for an electrostatics chuck 10 without a substrate 14. As set forth above, the operating frequency of the square wave generator 80 may affect the magnitude of the ripple voltage and currents. Lower frequencies tend to produce larger differences in the magnitudes of the ripple voltages and currents, and thus tend to make measurements of those differences easier. The magnitudes of the ripple voltages and currents may also be used to compare chucking quality from substrate to substrate by comparing the magnitudes of the ripple voltages, for example, from substrate to substrate. A higher ripple voltage for a chucked substrate may indicate that the chuck is dirty and needs to be cleaned, or that the chuck may need to be replaced. The magnitude of the ripple voltage or current may also be monitored during the manufacturing process and may assist in detecting substrate slip on the chuck.

Figure 8:
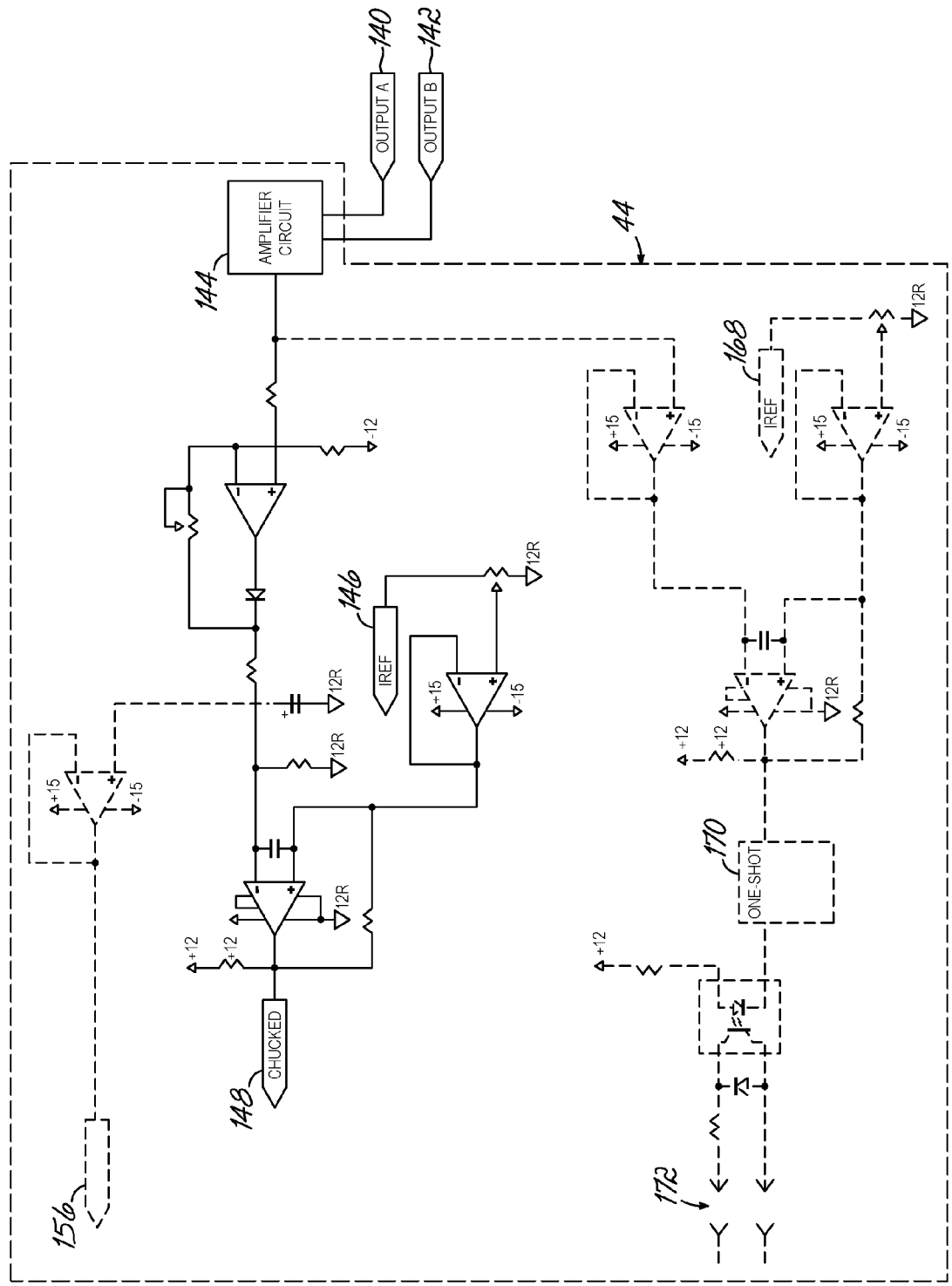
FIG. 8 is a schematic diagram of several of the components of the ripple detection circuitry of FIG. 2.

More specifically, and as seen in FIG. 8, the outputs from the poles OUTPUT A 140 (also shown in FIG. 4) and OUTPUT B 142 from the power supply are sent to an amplifying circuit 144. The amplifier circuit 144 amplifies the signals from the opposite poles, buffers and then sums the signals to provide a larger signal to the remainder of the ripple detection circuitry 44, which, in some embodiments, produces several outputs which can be seen in the graph in FIG. 9 and which will be addressed in turn.

Figure 9:
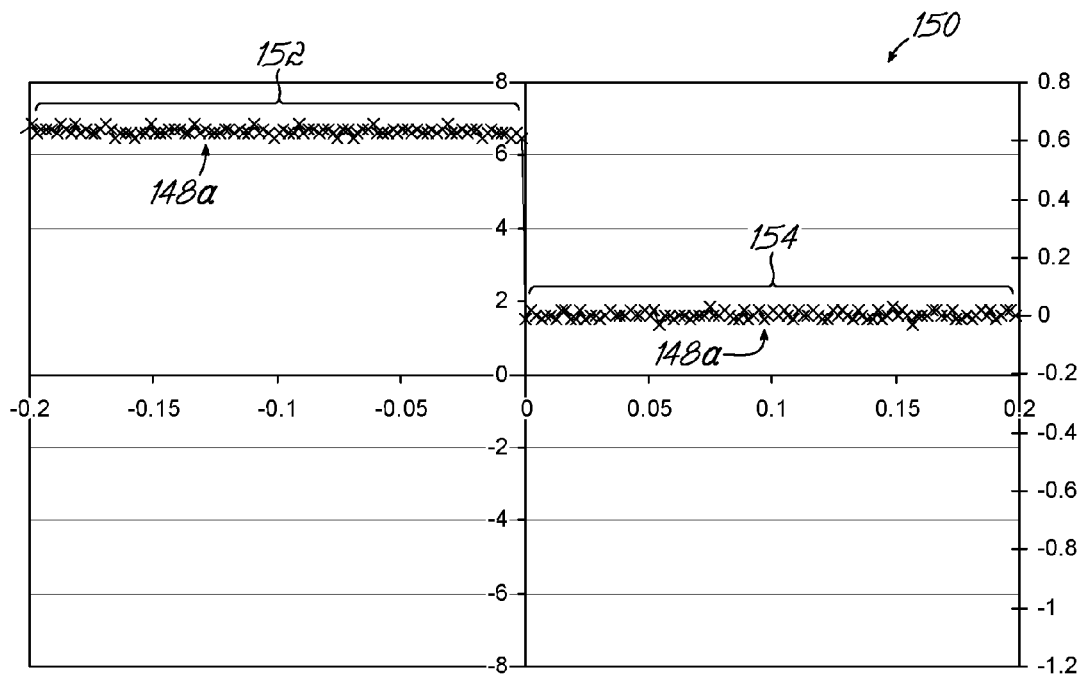
FIG. 9 is a graph illustrating an output of the chuck detect circuit of FIG. 8

The amplified signal from the amplifier circuit is rectified and compared to a reference signal 146 to produce a "high" or "low" indication of a substrate 14 present on the electrostatic chuck 10. The chuck detect 148 signal, as seen in the curve 148*a* in the graph 150 in FIG. 9, provides a "high" signal output when a substrate 14 is present on the electrostatic chuck 10. In the graph 150, area 152 of curve 148*a* shows a signal produced indicating a substrate 14 on the chuck. When the substrate is removed, represented by area 154 of curve 148*a*, the signal drops to a "low".

Figure 10:
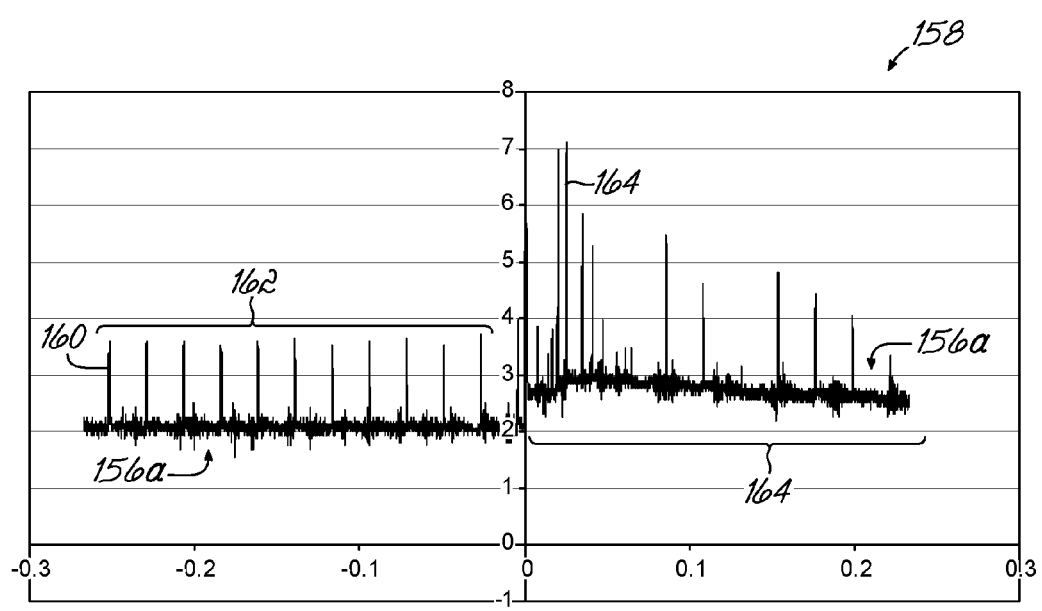
FIG. 10 is a graph illustrating filtered and unfiltered signals representing chucking quality.

A chuck quality signal 156 is taken prior to the comparison to the reference for the chucking detection and is heavily filtered to a DC output 156. This DC output may assist in monitoring the quality of the chucking process. As seen in the graph 158 in FIG. 10, an unfiltered chucking quality signal is represented by curve 160. The area 162 of curve 160 shows a series of uniform spikes indicating that a substrate 14 is present on the electrostatic chuck 10. However, as can be seen in the area 164 of curve 160, as the substrate 14 moves, the ripple voltage greatly increases as illustrated by the spikes such as 166. By filtering these signals, represented by curve 156*a*, a measure of chucking quality can be monitored. As also seen in the area 164 of curve 156*a*, as the movement of the substrate settles, the chucking quality signal does not return to its previous value, but rather indicates an increase, or loss of chucking quality. This may result from particles from the substrate 14 being left behind on the electrostatic chuck 10 due to movement of the chuck or other outside contaminants, which may affect the chucking quality of subsequent substrates 14. As the chucking quality value 156 continues to increase, the quality decreases and at some point, the electrostatic chuck 10 will need to either be cleaned or replaced. It should be noted, though, while the signals produced may indicate to an operator or technician that the electrostatic chuck 10 needs some type of attention, these signals are not high enough to produce a CHUCK FLT signal.

The unfiltered signal may also be used to detect movement indicating slippage or bouncing/flexing of the substrate 14. The detection circuit for the fast moving peak utilizes the ripple signal directly from the amplifier circuit 144. This signal is calibrated with a reference threshold 168 to filter out noise type spikes that may incorrectly be interpreted a substrate 14 movement. The resulting signal is sent through a pulse stretcher 170, such as a one-shot, to facilitate recognition of the slippage or other movement. The pulse stretcher 170 can be configured in a non-retriggerable or a retriggerable mode on rising edges. The output may then be sent to an opto-coupler 172 in some embodiments, or other transmission medium in other embodiments.

Figure 11:
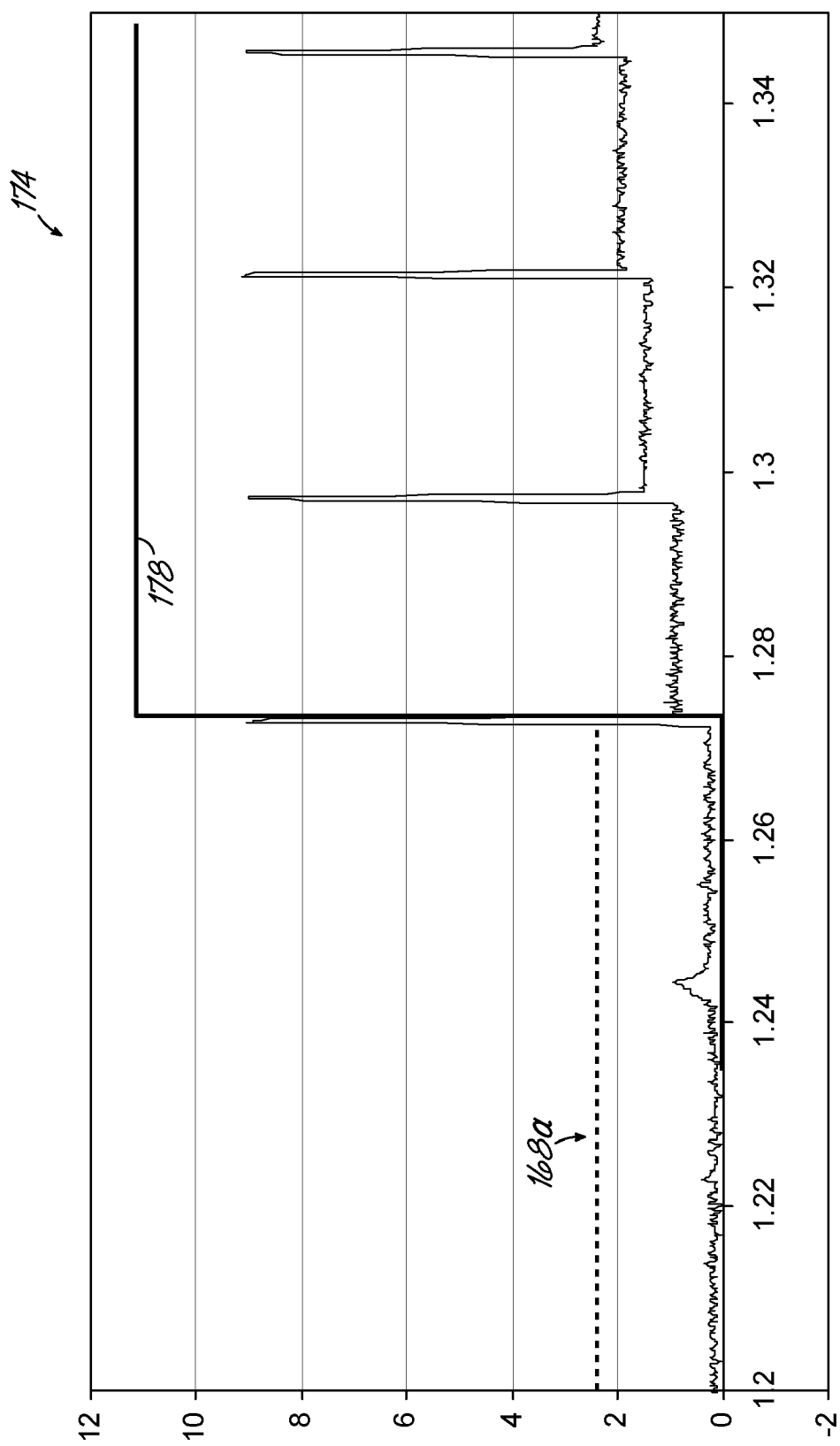
FIG. 11 is a graph illustrating pulse stretching of an unfiltered signal representing chucking quality.
Figure 12A:
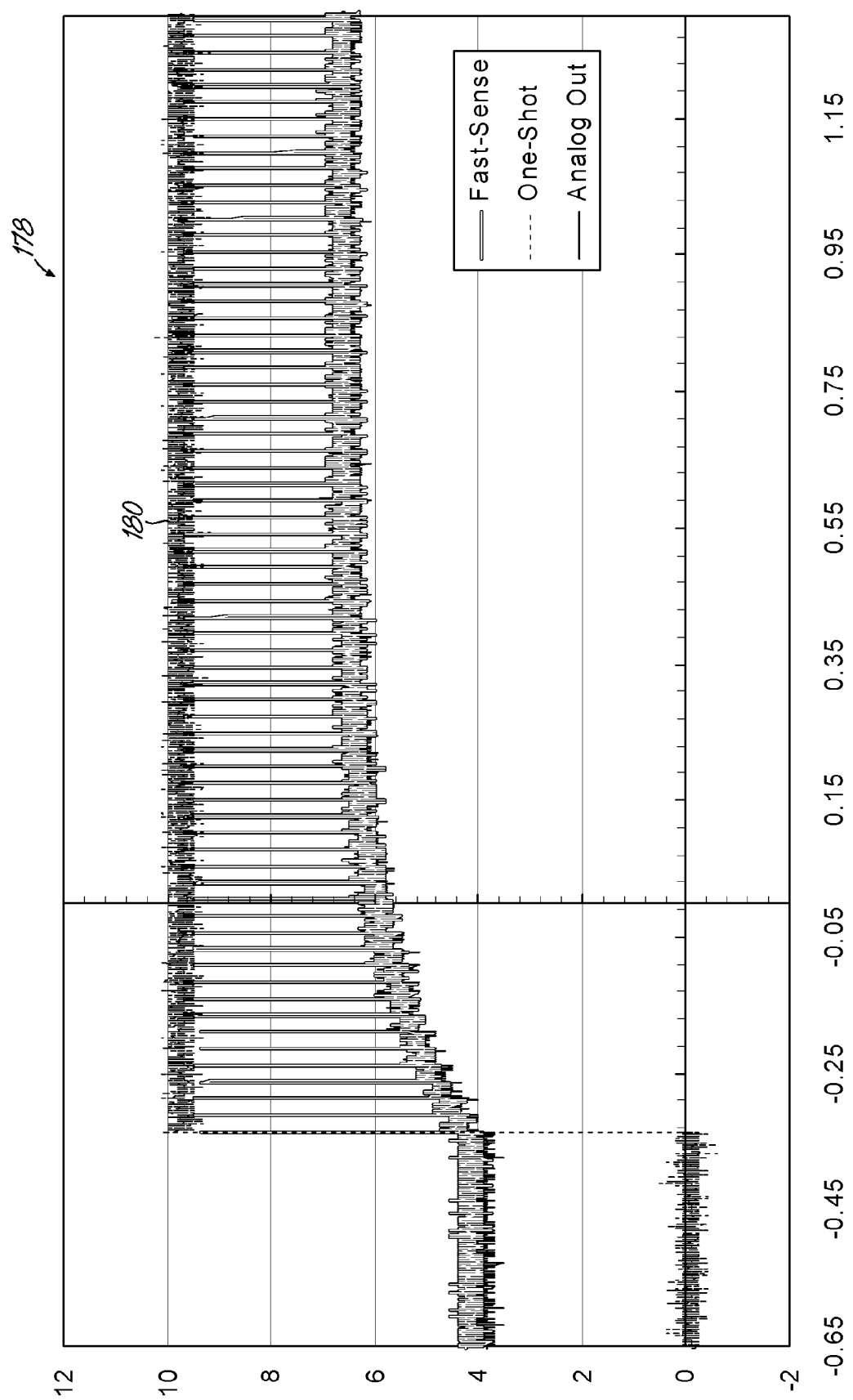
FIG. 12A is a graph illustrating a pulse stretcher being continually retriggered.
Figure 12B:
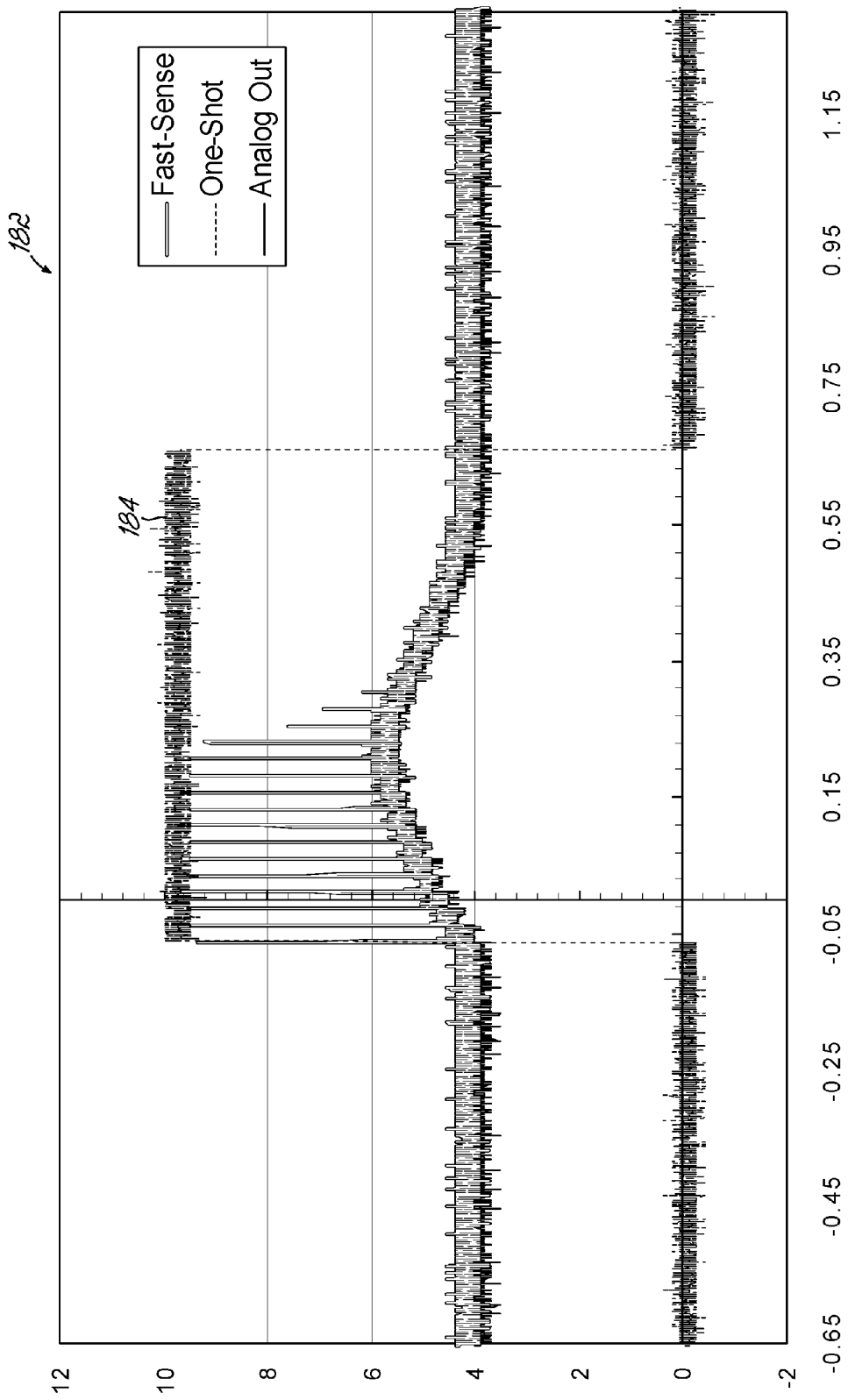
FIG. 12B is a graph illustrating a pulse stretcher responsive to a single trigger event.
Figure 12C:
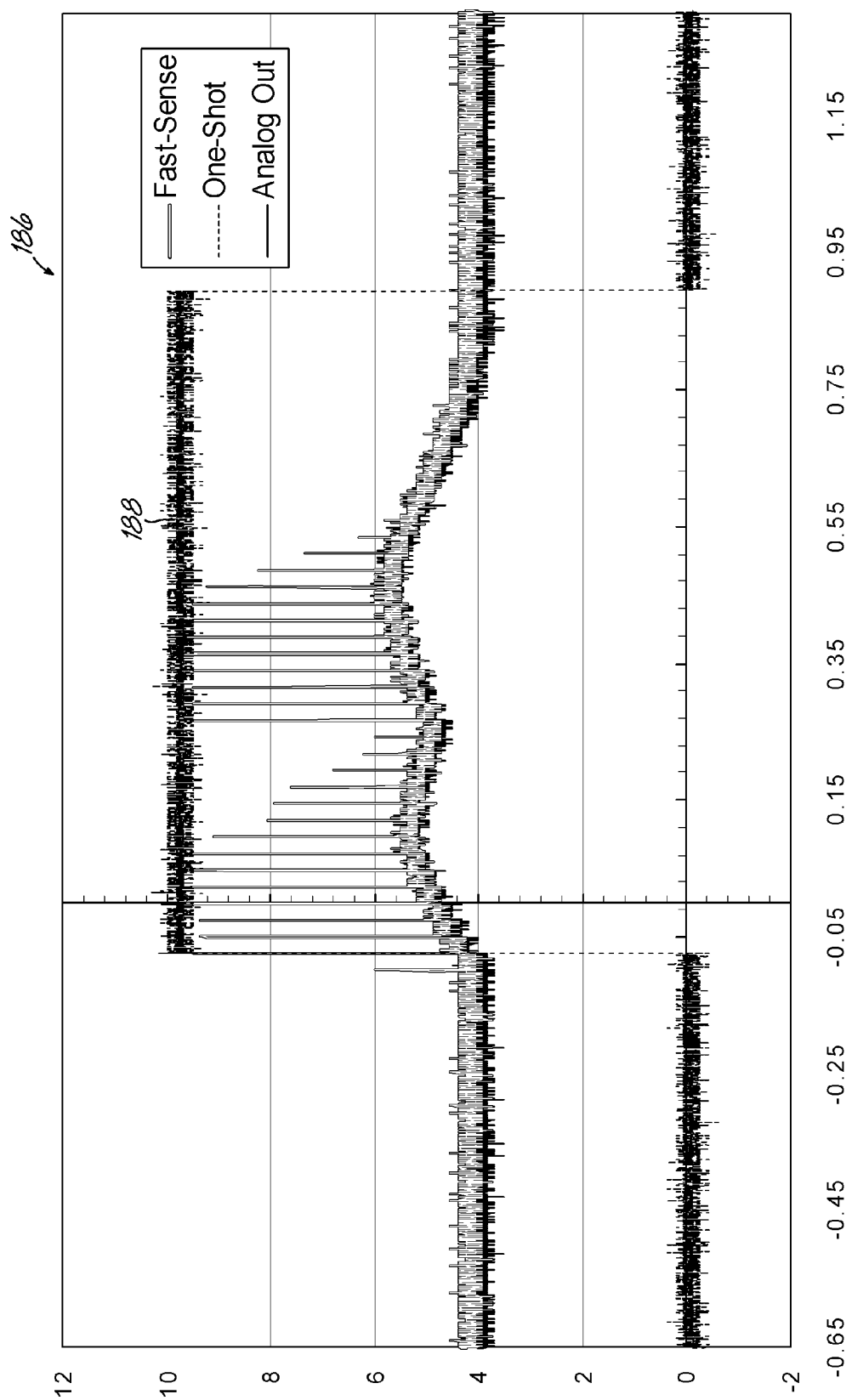
FIG. 12C is a graph illustrating a pulse stretcher response to multiple trigger events.

Graph 174 in FIG. 11 shows the threshold 168*a* level as well as the triggered and extended pulse 176 indicating slippage or other movement of the substrate 14. FIGS. 12A-C show additional examples of the pulse stretching. Graph 178 in FIG. 12A illustrates a long chucking problem, where the curve 180 shows the pulse stretcher 170 being continually retriggered. Graph 182 in FIG. 12B illustrates a single event chucking problem, such as a slip or bounce, with one trigger of the pulse stretcher 170. As illustrated by curve 184 in this case, the pulse stretcher times out after a predetermined period of time and is ready to detect another event. Graph 186 in FIG. 12C illustrates multiple chucking problems where the pulse stretcher 170 is triggered and retriggered, which can be seen on the curve 188. The time duration of the pulse stretcher 170 is control system driven with typical times ranging from approximately 100 ms to approximately 600 ms based on the control loop drive time period, although other times may be used for other embodiments.

Low frequency, trapezoidal outputs reduce peak-voltage stresses, and the all-in-one approach utilizing the power supply output signals to both clamp and detect the substrate assists in cost effectiveness, lowering particle contamination, and adds reliability. Embodiments of the invention take advantage of the output characteristics of the low-frequency AC (or unfiltered DC) output stage to detect the presence of a substrate and require no additional connections external to the power supply, requiring no extra in-vacuum sensors or connections. Furthermore the indication of chucking quality from the ripple detection circuitry as well as the ability to detect slippage or other movement of the wafer can assist in providing better wafer to wafer consistency.

While the present invention has been illustrated by a description of one or more embodiments thereof and while these embodiments have been described in considerable detail, they are not intended to restrict or in any way limit the scope of the appended claims to such detail. Additional advantages and modifications will readily appear to those skilled in the art. The invention in its broader aspects is therefore not limited to the specific details, representative apparatus and method, and illustrative examples shown and described. Accordingly, departures may be made from such details without departing from the scope of the general inventive concept.

What is claimed is:

1. A detection circuit for a power supply for an electrostatic chuck, the power supply having a signal generating circuit configured to generate an input, a power output circuit configured to produce a signal for the electrostatic chuck in response to the input signal, and a feedback circuit electrically connected to the power output circuit and configured to feed back a voltage signal responsive to a voltage on the electrostatic chuck, wherein the signal from the power output circuit is a trapezoidal waveform with approximately flat tops and minimal dead-time between phase reversals, the detection circuit electrically connected to the electrostatic chuck through the feedback circuit and comprising:

an amplifying circuit receiving inputs from the power output circuit and producing an amplified buffered signal;

a chucking quality circuit receiving the signal from the amplifying circuit, and configured to produce a signal indicative of a quality of a chucked substrate; and a movement detection circuit receiving the signal from the amplifying circuit, and configured to produce a signal indicative of movement of the substrate on the chuck.

2. The detection circuit of claim 1, further comprising:
a chucking detect circuit receiving the signal from the amplifying circuit, and configured to produce a first signal indicative of a substrate on the chuck and a second signal indicative of a chuck without a substrate.

3. The detection circuit of claim 1, wherein the chucking quality circuit comprises:
a circuit configured to rectify and filter the amplified buffered signal producing a DC output,
wherein an increasing DC value in the DC output indicates a decrease in chucking quality.

4. The detection circuit of claim 1, wherein the movement detection circuit comprises:
a circuit configured to calibrate the amplified buffered signal with a threshold voltage; and
a pulse stretcher configured to produce a signal representative of a short duration pulse, having a duration greater than the short duration pulse, in response to a triggering event.

5. The detection circuit of claim 4, wherein the pulse stretcher comprises a one-shot.

6. The detection circuit of claim 4, wherein the pulse stretcher is triggered on a rising edge of the amplified buffered signal.

7. A power supply comprising the detection circuit of claim 1, the power supply further comprising:
a signal generating circuit configured to generate a square wave signal;
an amplifying circuit electrically connected to the signal generating circuit configured to amplify the square wave signal;
a transformer having a primary winding and a secondary winding, the primary winding electrically connected to the amplifying circuit, and the secondary winding configured to be electrically connected to said electrostatic chuck, the secondary winding producing a signal for said electrostatic chuck; and
a voltage divider circuit electrically connected to the secondary winding and further connected to the amplifying circuit, the voltage divider circuit configured to reduce the voltage of the signal for the electrostatic chuck and feed back the reduced voltage signal to the amplifying circuit,
wherein the signal from the secondary winding is a trapezoidal waveform with approximately flat tops and minimal dead-time between phase reversals.

8. A system comprising the power supply of claim 7, the system further comprising:
an electrostatic chuck,
wherein the signal from the secondary winding is applied to the electrostatic chuck.

9. A semiconductor processing system, comprising:
an electrostatic chuck; and
a power supply configured to provide power to the electrostatic chuck, the power supply including:
a signal generating circuit configured to generate an input;
a power output circuit configured to produce a signal for the electrostatic chuck in response to the input signal;
a feedback circuit electrically connected to the power output circuit and configured to feed back a voltage signal responsive to a voltage on the electrostatic chuck; and
a detection circuit electrically connected to the electrostatic chuck, through the feedback circuit and configured to interpret the voltage signal and to produce an output signal indicative of a condition of a substrate on the electrostatic chuck.

10. The semiconductor processing system of claim 9, wherein the signal from the power output circuit is a trapezoidal waveform with approximately flat tops and minimal dead-time between phase reversals.

11. The semiconductor processing system of claim 9, wherein the detection circuit comprises:
an amplifying circuit receiving inputs from the power output circuit and producing an amplified buffered signal; and
a chucking detect circuit receiving the signal from the amplifying circuit, and configured to produce a first signal indicative of a substrate on the chuck and a second signal indicative of a chuck without a substrate.

12. The semiconductor processing system of claim 9, wherein the detection circuit comprises:
an amplifying circuit receiving inputs from the power output circuit and producing an amplified buffered signal; and
a chucking quality circuit receiving the signal from the amplifying circuit, and configured to produce a signal indicative of a quality of a chucked substrate.

13. The semiconductor processing system of claim 12, wherein the chucking quality circuit comprises:
a circuit configured to rectify and filter the amplified buffered signal producing a DC output,
wherein an increasing DC value in the DC output indicates a decrease in chucking quality.

14. The semiconductor processing system of claim 9, wherein the detection circuit comprises:
an amplifying circuit receiving inputs from the power output circuit and producing an amplified buffered signal; and
a movement detection circuit receiving the signal from the amplifying circuit, and configured to produce a signal indicative of movement of the substrate on the chuck.

15. The semiconductor processing system of claim 14, wherein the movement detection circuit comprises:
a circuit configured to calibrate the amplified buffered signal with a threshold voltage; and
a pulse stretcher configured to produce a signal representative of a short duration pulse, having a duration greater than the short duration pulse, in response to a triggering event.

16. The semiconductor processing system of claim 15, wherein the pulse stretcher comprises a one-shot.

17. The semiconductor processing system of claim 15, wherein the pulse stretcher is triggered on a rising edge of the amplified buffered signal.

18. A method of detecting a condition of a substrate on an electrostatic chuck in a processing apparatus, the method comprising:
sensing a voltage on an output of a power supply connected to the electrostatic chuck for supplying a chucking voltage to the chuck through a feedback circuit;
detecting a change in the sensed voltage indicative of a change of a condition of the substrate on the chuck; and controlling an operation of the processing apparatus in response to the detecting of the change in sensed voltage, wherein sensing the voltage on the output of the power supply comprises:

filtering and buffering the voltage to generate a DC voltage.

19. The method of claim 18, wherein the detected change in the sensed voltage comprises an increasing DC value, the change of the condition comprises an increase in buildup of material between the chuck and the substrate, and the operation comprises initiating a cleaning or replacement of the chuck.

20. A method of detecting a condition of a substrate on an electrostatic chuck in a processing apparatus, the method comprising:

sensing a voltage on an output of a power supply connected to the electrostatic chuck for supplying a chucking voltage to the chuck through a feedback circuit;

detecting a change in the sensed voltage indicative of a change of a condition of the substrate on the chuck; and controlling an operation of the processing apparatus in response to the detecting of the change in sensed voltage, wherein sensing the voltage on the output of the power supply comprises calibrating the voltage on the output of the power supply with a reference voltage and wherein detecting a change in the sensed voltage comprises:

detecting a short duration pulse in the voltage on the output of the power supply that exceeds the reference voltage; and generating a signal representative of a short duration pulse with a pulse stretcher having a duration greater than the short duration pulse.

21. The method of claim 20, wherein the change of the condition is a movement of the substrate on the chuck.

\* \* \* \* \*